(12) United States Patent
McColloch et al.

(10) Patent No.: US 8,483,571 B2
(45) Date of Patent: Jul. 9, 2013

(54) OPTICAL BEAM SPLITTER FOR USE IN AN OPTOELECTRONIC MODULE, AND A METHOD FOR PERFORMING OPTICAL BEAM SPLITTING IN AN OPTOELECTRONIC MODULE

(75) Inventors: Laurence R. McColloch, Santa Clara, CA (US); Pengyue Wen, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 458 days.

(21) Appl. No.: 12/828,278

(22) Filed: Jun. 30, 2010

(65) Prior Publication Data

US 2012/0002284 A1 Jan. 5, 2012

(51) Int. Cl.
*H04B 10/12* (2006.01)
*H04B 10/04* (2006.01)
*H04B 10/06* (2006.01)
*G02B 27/14* (2006.01)

(52) U.S. Cl.
USPC ............ 398/141; 359/629; 398/200; 398/214

(58) Field of Classification Search
USPC .... 359/558, 566, 569, 572, 629, 636; 385/15, 385/31, 37; 398/82, 84, 87, 141, 168–170, 398/200, 201, 212, 214
See application file for complete search history.

(56) References Cited

U.S. PATENT DOCUMENTS

| | | | |
|---|---|---|---|
| 4,421,383 A | 12/1983 | Carlsen | |
| 5,743,785 A | 4/1998 | Lundberg et al. | |
| 5,809,050 A | 9/1998 | Baldwin et al. | |
| 6,005,991 A | 12/1999 | Knasel | |
| 6,085,003 A | 7/2000 | Knight | |
| 6,188,062 B1 | 2/2001 | Lee | |
| 6,442,323 B1 | 8/2002 | Sorosiak | |
| 6,488,026 B2 | 12/2002 | Lauer | |
| 6,526,076 B2 | 2/2003 | Cham et al. | |
| 6,821,028 B2 | 11/2004 | Morris et al. | |
| 6,850,671 B2 | 2/2005 | Carnevale et al. | |
| 6,886,988 B2 | 5/2005 | Brown et al. | |
| 6,888,988 B2 | 5/2005 | Vancoille et al. | |
| 6,939,058 B2 | 9/2005 | Gurevich et al. | |
| 7,245,813 B2 | 7/2007 | Brown et al. | |
| 7,280,732 B2 | 10/2007 | Granger et al. | |
| 7,296,935 B1 | 11/2007 | Childers et al. | |
| 7,841,777 B2 | 11/2010 | Howard et al. | |

(Continued)

FOREIGN PATENT DOCUMENTS

| | | |
|---|---|---|
| GB | 2374142 | 10/2002 |
| JP | 2004-212847 | 7/2004 |
| WO | WO 00/13051 | 3/2000 |

*Primary Examiner* — Stephone Allen
*Assistant Examiner* — Kimberly N Kakalec

(57) ABSTRACT

An optical beam splitter for use in an optoelectronic module and method are provided. The optical beam splitter is configured to split a main beam produced by a laser into at least first and second light portions that have different optical power levels. The first light portion, which is to be coupled into an end of a transmit optical fiber of an optical communications link, has an optical power level that is within eye safety limits and yet has sufficient optical power to avoid signal degradation problems. The optical power level of the first light portion is less than the optical power level of the second light portion. The optical beam splitter is capable of being implemented in a unidirectional or a bidirectional optical link.

20 Claims, 13 Drawing Sheets

U.S. PATENT DOCUMENTS

| | | |
|---|---|---|
| 8,032,003 B2 | 10/2011 | Childers et al. |
| 8,052,334 B2 | 11/2011 | Childers et al. |
| 8,104,973 B2 | 1/2012 | Howard et al. |
| 2004/0096165 A1 | 5/2004 | Childers et al. |
| 2006/0115217 A1 | 6/2006 | Childers et al. |
| 2006/0115218 A1 | 6/2006 | Childers et al. |
| 2006/0210225 A1 | 9/2006 | Fujiwara et al. |
| 2007/0242572 A1 | 10/2007 | Ogata |
| 2009/0047024 A1* | 2/2009 | Wang et al. .................. 398/135 |
| 2010/0135618 A1 | 6/2010 | Howard et al. |
| 2010/0162858 A1 | 7/2010 | Rogers |
| 2010/0202735 A1 | 8/2010 | Childers et al. |
| 2010/0215319 A1 | 8/2010 | Childers et al. |
| 2011/0206324 A1 | 8/2011 | Childers et al. |
| 2011/0229678 A1 | 9/2011 | Childers et al. |

* cited by examiner

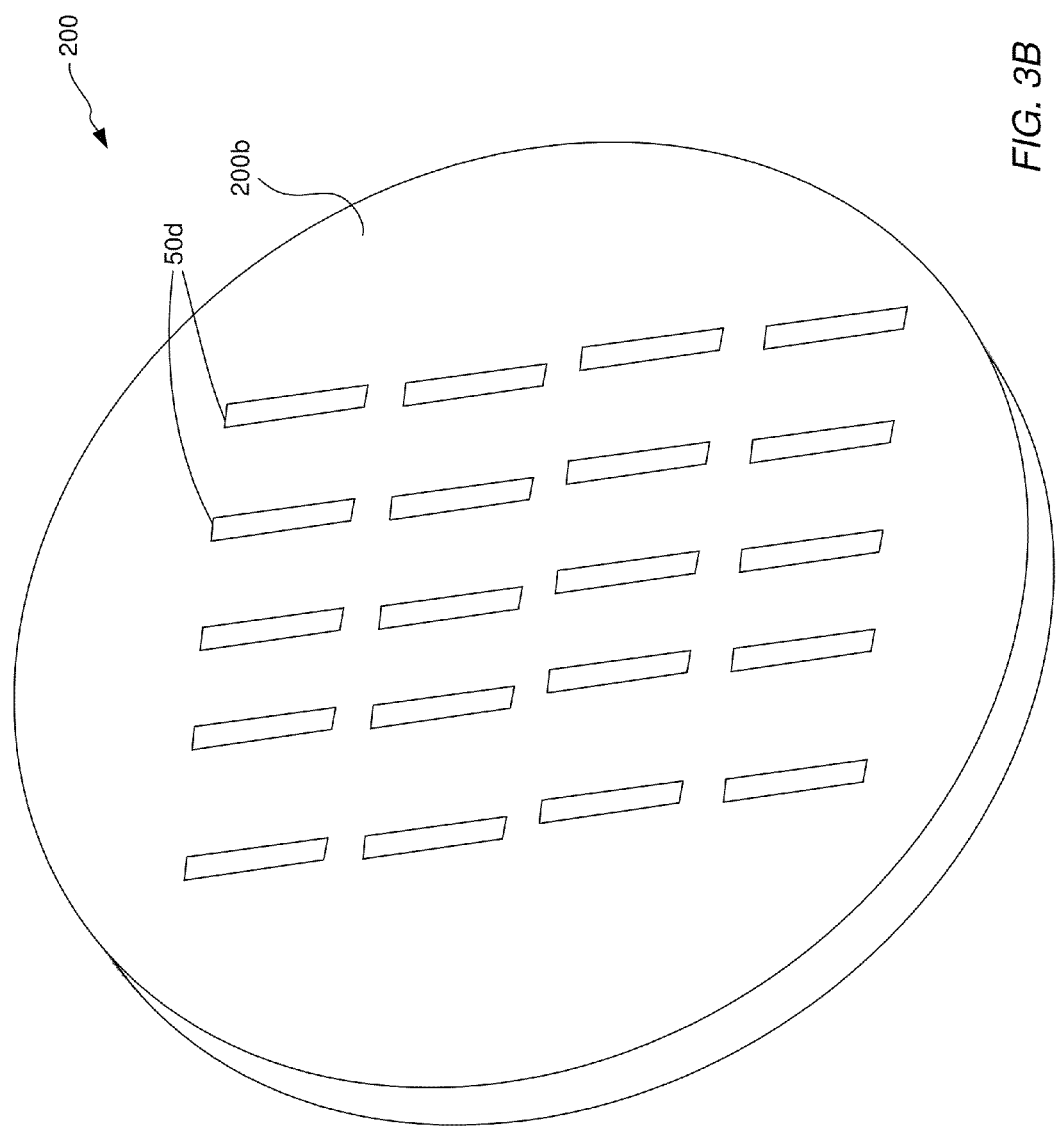

OPTICAL BEAM SPLITTER FOR USE IN AN OPTOELECTRONIC MODULE, AND A METHOD FOR PERFORMING OPTICAL BEAM SPLITTING IN AN OPTOELECTRONIC MODULE

TECHNICAL FIELD OF THE INVENTION

The invention relates to optoelectronic modules. More particularly, the invention relates to an optical beam splitter for use in an optoelectronic module for splitting a beam into at least two portions that have different levels of optical power.

BACKGROUND OF THE INVENTION

In optical communications networks, optoelectronic modules are used to transmit and/or receive optical signals over optical fibers. The optoelectronic module may be configured as an optical transmitter that transmits optical signals, an optical receiver that receives optical signals, or an optical transceiver that transmits and receives optical signals. On the transmit side of an optical transmitter or transceiver module, a light source (e.g., a laser diode) generates amplitude modulated optical signals that represent data, which are optically coupled by an optics system of the module into an end of a transmit optical fiber. The signals are then transmitted over the transmit fiber to a receiver node of the network. On the receive side of an optical receiver or transceiver module, an optics system of the module receives optical signals output from an end of a receive optical fiber and focuses the optical signals onto an optical detector (e.g., a photodiode), which converts the optical energy into electrical energy.

In some laser-based optoelectronic modules, a portion of the light that is produced by the laser is used to monitor the optical output power level of the laser and to adjust the optical output power level of the laser as needed. Typically, it is desirable to maintain the optical output power level of the laser at a substantially constant, predetermined level during operations. To accomplish this, many optoelectronic modules include components that together make up a feedback control system for monitoring the average optical output power level of the laser and adjusting the bias and/or modulation currents of the laser as needed to maintain that average optical output power level at a substantially constant, predetermined level. The feedback path components typically include a beam splitter, a monitor photodiode, analog-to-digital (ADC) circuitry, and controller circuitry. The beam splitter causes a portion of the beam that is produced by the laser to be split off and directed onto a monitor photodiode. The monitor photodiode produces an analog electrical signal in response to the light that is directed onto it by the beam splitter. The analog electrical signal is converted into a digital electrical signal by the ADC circuitry. The controller circuitry processes the digital electrical signal and causes the laser modulation and/or bias currents to be adjusted accordingly.

Beam splitters are manufactured in a variety of configurations and typically comprise one or more reflective, refractive and/or diffractive elements. In a typical beam splitter configuration, a first portion of the main beam produced by the laser passes through the beam splitter with very little if any of the light being reflected, refracted or diffracted. This portion of the main beam is then coupled into the end of the transmit optical fiber for transmission over the transmit optical fiber. At the same time, a second portion of the main beam is reflected, refracted and/or diffracted by the beam splitter to cause the second portion to be directed onto the monitor photodiode.

Usually, the first and second portions each contain about 50% of the optical power that was contained in the main beam. This symmetric, or even, split of the optical power can cause problems in some cases. Typical lasers that are used in optoelectronic modules produce light having optical power levels that are much greater than safety limits for the human eye. Even at 50% of the optical power of the main beam, the first portion of the light will have an optical power level that is greater than eye safety limits. It is generally not possible, or at least very difficult, to run a laser at the high speed required for the optical communications link and simultaneously reduce the optical output power level of the laser to a level that is within eye safety limits. For this reason, steps are often taken to ensure that the light that is to be transmitted over the transmit optical fiber is attenuated to an optical power level that is within the safety limits.

Accordingly, a need exists for an optical beam splitter for use in an optoelectronic module that is capable of providing an uneven, or asymmetrical, split of the main beam produced by the laser such that the portion of the light that is split off and coupled into the end of the transmit optical fiber as the optical data signal has an optical power level that is within human eye safety limits and yet that has sufficient optical power to avoid signal degradation problems.

SUMMARY OF THE INVENTION

The invention is directed to an optical beam splitter for use in an optoelectronic module and a method for optically splitting a beam in an optoelectronic module. The optical beam splitter comprises a substrate having at least upper and lower surfaces that are parallel to one another, at least a first diffractive optical element formed on the lower surface of the substrate, and at least a first refractive optical element formed on the upper surface of the substrate. The first diffractive optical element receives a main beam of light produced by the light source and splits the main beam into at least first and second light portions L1 and L2, respectively. The first diffractive optical element tilts at least the first light portion L1 at a first preselected tilt angle relative to an imaginary line that is normal to the lower surface of the substrate and that extends between the lower and upper surfaces of the substrate. The first and second light portions L1 and L2 each have a particular percentage of the optical power of the main light beam. The second light portion L2 has a substantially larger percentage of the optical power of the main light beam than the first portion L1. The first refractive optical element receives the tilted first light portion L1 and directs the first light portion L1 onto a lens assembly of the optoelectronic module to optically couple the first light portion L1 into an end of an optical fiber coupled to the lens assembly. The optical power of the first light portion L1 that is directed onto the lens assembly is within a human eye safety limit.

The method comprises the following. With a first diffractive optical element formed on a lower surface of a substrate, receiving a main beam of light produced by a light source of the optoelectronic module. With the first diffractive optical element, splitting the main beam into at least first and second light portions L1 and L2, respectively, and tilting at least the first light portion L1 at a first preselected tilt angle relative to an imaginary line that is normal to the lower surface of the substrate and that extends between the lower and upper surfaces of the substrate. The first and second light portions L1 and L2 each have a percentage of the optical power of the main light beam, and the second light portion L2 has a substantially larger percentage of the optical power of the main light beam than the first portion L1. With a first refractive optical element formed on the upper surface of the substrate, receiving the tilted first light portion L1 and directing the first light portion L1 onto a lens assembly of the optoelectronic module to optically couple the first light portion L1 into an end of an optical fiber coupled to the lens assembly. The optical power of the first light portion that is directed by the first refractive optical element onto the lens assembly is within a human eye safety limit.

These and other features and advantages of the invention will become apparent from the following description, drawings and claims.

BRIEF DESCRIPTION OF THE DRAWINGS

FIGS. 3A and 3B illustrate bottom and top perspective views, respectively, of a glass wafer having arrays of the optical elements of the optical beam splitter shown in FIG. 2 formed on the bottom and top surfaces thereof.

DETAILED DESCRIPTION OF AN ILLUSTRATIVE EMBODIMENT

The invention is directed to an optical beam splitter for use in an optoelectronic module. The optical beam splitter is configured to split a main beam produced by a laser into at least first and second light portions that have different optical power levels. The first light portion, which is to be coupled into an end of a transmit optical fiber of an optical communications link, has an optical power level that is within eye safety limits and yet has sufficient optical power to avoid signal degradation problems. The first light portion has an optical power level that is less than the optical power level of the second light portion. The optoelectronic module in which the optical beam splitter is employed may be an optical transmitter module or an optical transceiver module. The optical communications link may be a unidirectional optical link or a bidirectional optical link. However, in order to demonstrate the various capabilities and advantages of the optical beam splitter, a bidirectional configuration of the optical beam splitter that enables it to be used in a bidirectional optical link will be now described with reference to the figures.

Figure 1:
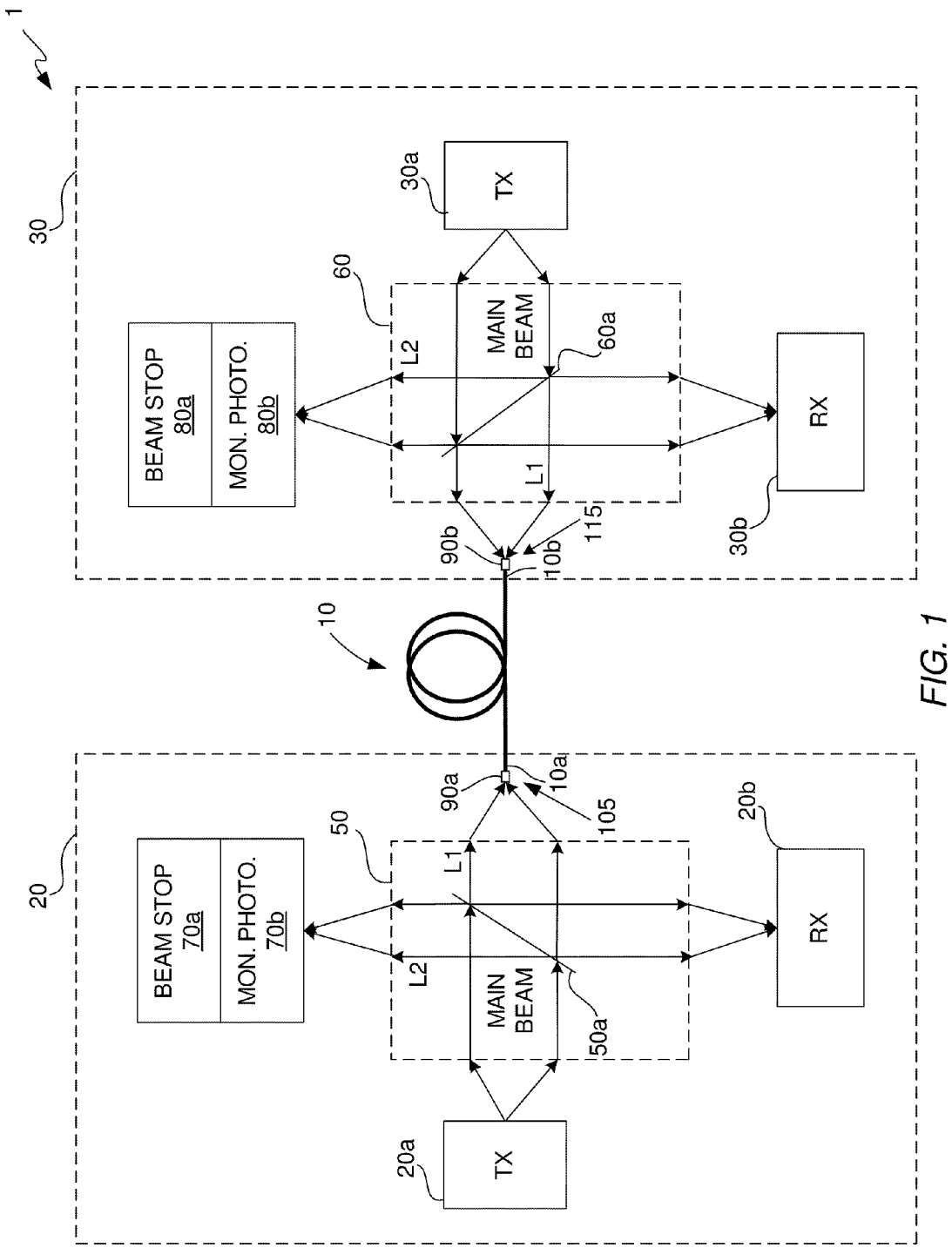
FIG. 1 depicts an illustrative embodiment of a bidirectional optical link comprising an optical fiber and optoelectronic modules coupled to opposite ends of an optical fiber that incorporate optical beam splitters in accordance with an illustrative embodiment of the invention.

FIG. 1 depicts an illustrative embodiment of a bidirectional optical link 1 comprising an optical fiber 10 and optoelectronic modules 20 and 30 coupled to opposite ends of an optical fiber 10, each of which incorporates an optical beam splitter in accordance with an illustrative embodiment of the invention. In accordance with this illustrative embodiment, the optoelectronic modules 20 and 30 are optical transceiver modules. The optical transceiver module 20 coupled to end 10a of the optical fiber 10 includes a TX 20a, an RX 20b, and an optical coupling system 50. The optical coupling system 50 of the optical transceiver module 20 incorporates an optical beam splitter 50a and one or more refractive, reflective and/or diffractive optical elements (not shown), as will be described below in detail with reference to FIG. 2. The optical beam splitter 50a and the other optical elements (not shown) may be separate elements or they may be integrated into a single integrated optical device, as will be described below with reference to FIG. 2. The optical transceiver module 30 coupled to end 10b of the optical fiber 10 includes a TX 30a, an RX 30b, and an optical coupling system 60. Like the optical coupling system 50, the optical coupling system 60 incorporates an optical beam splitter 60a and one or more refractive, reflective and/or diffractive optical elements. The optical transceiver module 20 includes a beam stop 70a and a monitor photodiode 70b. Likewise, the optical transceiver module 30 includes a beam stop 80a and a monitor photodiode 80b.

As will be described below in more detail with reference to FIG. 2, the TXs 20a and 30a of the optical transceiver modules 20 and 30 each include at least one light source, which is typically a laser diode, such as a vertical cavity surface emitting laser diode (VCSEL), for example, and light source driver circuitry. The RXs 20b and 30b of the optical transceiver modules 20 and 30 each include at least one optical-to-electrical (OE) conversion device, such as a photodiode, and receiver circuitry. The optical fiber 10 is typically a multimode (MM) optical fiber, such as, for example, an oM3 mM optical fiber. In accordance with this illustrative embodiment, the TXs 20a and 30a and the RXs 20b and 30b all operate at the same wavelength. The optical coupling systems 50 and 60 allow the optical transceiver modules 20 and 30 to simultaneously transmit and receive optical data signals that are at the same wavelength, which may be, for example, 850 nanometers (nm), 1310 nm or 1550 nm. The invention, however, is not limited with respect to the wavelength that is used for this purpose.

The optical transceiver modules 20 and 30 operate as follows. In the transmit direction of the optical transceiver module 20, the TX 20a produces a main beam of laser light having wavelength λ1, which is received by the optical coupling system 50. The optical coupling system 50 collimates the main beam, splits the main beam into at least first and second light portions L1 and L2, and tilts at least the first light portion L1 at a preselected angle relative to the angle of incidence of the main beam on the optical coupling system 50. In FIG. 1, the tilting of the first light portion L1 is not shown for ease of illustration. An example of an actual physical implementation of the optical coupling system 50 is described below in detail with reference to FIG. 2.

With reference again to FIG. 1, the first light portion L1 has less optical power than the second light portion L2. The first light portion L1 has between about 10% and 30% of the optical power of the main beam, and typically has about 20% of the optical power of the main beam. The second light portion L2 has between about 70% and 90% of the optical power of the main beam, and typically has about 80% of the optical power of the main beam. As will be described below in more detail with reference to FIG. 2, most of the second light portion L2 is absorbed by the beam stop 70a and a very small amount of the second light portion L2 is received by the monitor photodiode 70b and used as optical feedback to control optical output power level of the laser diode. Although the beam stops/monitor photodiodes 70a/70b and 80a/80b are depicted in FIG. 1 as being collocated, this is merely for ease of illustration, as will become clear from the description below of FIG. 2.

The first light portion L1 passes through the beam splitter 50a and is brought to a focal point by the optical coupling system 50 at the end 10a of the MM optical fiber 10. The first light portion L1 corresponds to the first optical data signal, which is then transmitted along the MM optical fiber 10 to the optical transceiver 30 coupled to the opposite end 10b of the MM optical fiber 10. As indicated above, most of the second light portion L2 is directed by the optical coupling system 50 onto the beam stop 70a while a very small portion of the second light portion L2 is directed onto the monitor photodiode 70b. Typically, the beam stop 70a receives and absorbs about 80% of the optical power of the main beam. By absorbing the light received thereby, the beam stop 70a prevents near-end stray light from affecting the performance of the optical transceiver module 20. As indicated above, the monitor photodiode 70b is used in a power monitoring feedback loop to monitor the optical output power of the laser diode of the TX 20a. The monitor photodiode 70b typically receives only about 1% to 2% of the optical power of the main beam.

Transparent stubs 90a and 90b are placed on the ends 10a and 10b, respectively, of the MM optical fiber 10. The stubs 90a and 90b have first ends that attach to respective optical ports 105 and 115, respectively, of the optical transceiver modules 20 and 30, respectively. The stubs 90a and 90b have second ends that attach to the ends 10a and 10b, respectively, of the MM optical fiber 10. The ends of the stubs 90a and 90b that attach to the optical ports 105 and 115 have anti-reflection coatings thereon. The ends of the stubs 90a and 90b that have the anti-reflection coatings thereon will be referred to hereinafter as the entrance facets of the stubs 90a and 90b. The ends of the stubs 90a and 90b that attach to the ends 10a and 10b of the MM optical fiber 10 are attached in such a way that no light is reflected at the interfaces of the stubs 90a and 90b and the ends 10a and 10b, respectively, of the MM optical fiber 10. The stubs 90a and 90b essentially eliminate all interface reflections at the optical ports 105 and 115, thereby preventing signal degradation due to cross-talk that might otherwise be caused by reflections of light at these interfaces. It should also be understood that as part of normal operation of the optical transceiver modules 20 and 30, the fiber 10 may be attached to and detached from the respective optical ports 105 and 115, and hence to and from the respective stubs 90a and 90b. Stubs of the type that may be used for this purpose are well known in the art. Therefore, persons of ordinary skill in the art will understand, in view of the description provided herein, the manner in which the stubs 90a and 90b may be designed and implemented in the bi-directional optical link 1 shown in FIG. 1.

In the receive direction of the optical transceiver module 20, an optical data signal of wavelength λ1 that has been transmitted by the optical transceiver module 30 over the MM optical fiber 10 is received by the optical coupling system 50. The stub 90b prevents interface reflections from occurring in the optical transceiver module 30 that might otherwise result in cross-talk and signal degradation. The beam splitter 50a reflects the received optical data signal in a direction toward the RX 20b and the light is focusing by the optical coupling system to a focal point on a photodiode (not shown) of the RX 20b. The light that is focused on the photodiode of the RX 20b has about 70% to 90%, and typically about 80%, of the optical power of the optical data signal that passes out of the end 10a of the MM optical fiber 10 and into the optical coupling system 50. The other 10% to 30% of the received light, and typically about 20%, may pass into the laser diode (not shown) of the TX 20. This relatively small amount of light is not focused on the laser diode, but is somewhat diffuse, and typically will not significantly degrade the performance of the laser diode of the TX 20.

The operations for the transmit and receive directions of the optical transceiver module 30 are identical to the operations described above for the transmit and receive directions of the optical transceiver module 20. Therefore, in the interest of brevity, the operations of the optical transceiver module 30 in the transmit and receive directions will not be described herein. It should also be noted that although the optical transceiver modules 20 and 30 shown in FIG. 1 are depicted as each having a single TX channel and a single RX channel and associated components, the invention may be implemented in a parallel optical transceiver module that has a plurality of instances of the optical transceiver modules 20 and 30 and multiple respective optical fibers 10 linking the respective modules together.

The stubs 90a and 90b are optional. If the stubs 90a and 90b are not used and no other techniques are used to eliminate interface reflections, the link 1 may still operate satisfactorily, but there may be a performance penalty in terms of increased signal degradation. The interface reflection is typically only approximately 4% of the total energy of the optical data signal. Therefore, it is possible to have satisfactory performance without totally eliminating interface reflection. Another option to using the stubs 90a and 90b is to employ some form of electronic equalization in the RXs 20b and 30b to cancel out the interface reflection. It is possible to use electronic equalization for this purpose due to the fact that any interface reflection generally will always occur at the same instant in time relative to the transmission of the optical data signal at the near-end optical transceiver. For example, electronic equalizers (not shown) may be used in the RXs 20b and 30b to perform interface reflection cancellation. The manner in which electronic equalizers may be used to perform interface refection cancellation is known to persons of ordinary skill in the art.

Assuming, for exemplary purposes only, that each of the TXs 20a and 30a has a VCSEL or other laser diode that transmits at a data rate of at least 10 Gb/s, and that each of the RXs 20b and 30b has a photodiode (e.g., a P-I-N photodiode) that is capable of detecting optical data signals at a data rate of at least 10 Gb/s, then the aggregate data rate of the bi-directional optical link is at least 20 Gb/s. It should be noted, however, that the invention is not limited with respect to the data rates of the TXs 20 and 30 or with respect to the aggregate data rate of the link 1.

Figure 2:
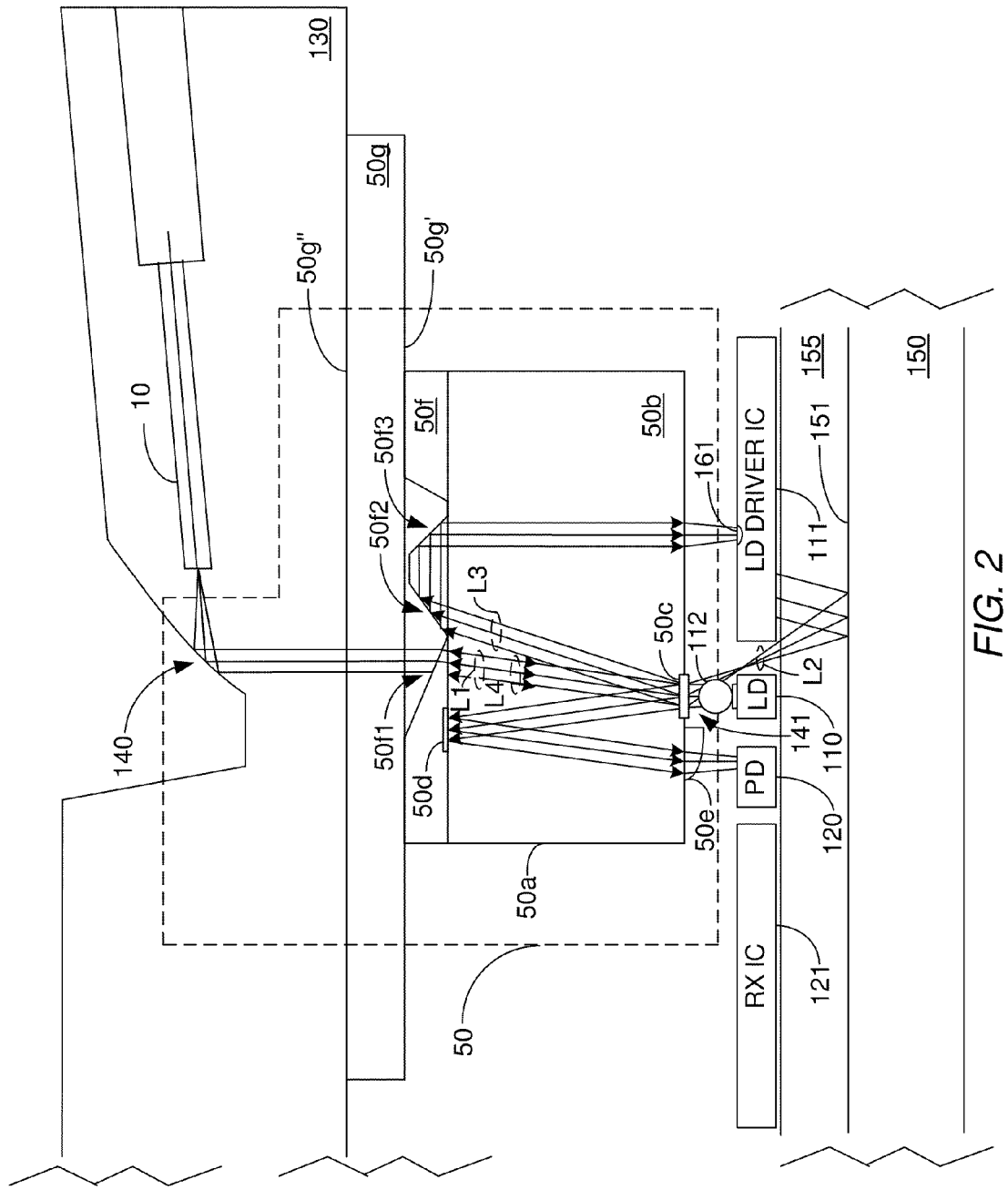
FIG. 2 illustrates a side cross-sectional view of an illustrative embodiment of one of the optical beam splitters illustrated in FIG. 1.

FIG. 2 illustrates a side cross-sectional view of an exemplary embodiment of the optical coupling system 50 functionally illustrated in FIG. 1. A laser diode (LD) 110 and a laser diode driver IC 111 of the TX 20a depicted in FIG. 1 are shown in FIG. 2. Also shown in FIG. 2 are the photodiode (PD) 120 and the RX IC 121 of the RX 30*a* depicted in FIG. 1. In accordance with this exemplary, or illustrative, embodiment, the optical beam splitter 50*a* of the optical coupling system 50 includes an integrated optical device comprising a substrate 50*b*, a plurality of optical elements 50*c*-50*e* formed in or on the substrate 50*b*, an optical coupling structure 50*f* disposed on an upper surface of the substrate 50*b*, and a glass cover 50*g* disposed on an upper surface of the optical coupling structure 50*f*.

In addition to the optical beam splitter 50*a*, the optical coupling system 50 includes a lens assembly 130. As will be described below 6-13, the lens assembly 130 is a part of an optical transceiver module (not shown). The lens assembly 130 mechanically couples the ends of a plurality of optical fibers 10 to the optical beam splitter 50*a*, although only one of the optical fibers 10 can be seen in the cross-sectional side view of FIG. 2. Light being coupled between the optical beam splitter 50*a* and the ends of the optical fibers 10 passes through the glass cover 50*g*. An array of refractive lenses 140 formed in the lens assembly 130 couple light between the ends of the optical fibers 10 and the optical beam splitter 50*a*. In the side view of FIG. 2, only the components associated with only a single RX channel and a single TX channel are shown. For example, only a single LD 110 of an array of LDs and only a single PD 120 of an array of PDs are shown in FIG. 2. Correspondingly, only a single refractive lens 140 of an array of lenses and a single optical fiber 10 of an array of optical fibers are shown in FIG. 2.

The manner in which the optical beam splitter 50*a* operates will now be described with reference to FIG. 2. In the transmit direction, the optical beam splitter 50*a* operates as follows. A main light beam 141 produced by the LD 110 is collimated by a "big eye" ball lens 112 and the collimated beam is directed onto the optical element 50*c*, which, in accordance with this illustrative embodiment, is a diffractive optical element. The diffractive optical element 50*c* may be configured to perform the collimation function, but using the big eye ball lenses 112 for this purpose has certain advantages. In particular, using big eye ball lenses for this purpose allows manufacturing tolerances to be relaxed. In addition, using the big eye ball lenses 112 allows multiple small arrays of VCSELs instead of a single large array of VCSELs to be used for the LDs 110, which can provide significant cost savings.

The diffractive optical element 50*c* splits the main light beam 141 into a first light portion L1, a second light portion L2, and a third light portion L3. The first light portion L1 has about 10% to 30%, and typically about 20%, of the optical power of the main beam 141. The first light portion L1 corresponds to the optical data signal that is ultimately coupled into the end of the optical fiber 10 for transmission over the link 1 (FIG. 1). The diffractive optical element 50*c* also performs a beam tilting operation that tilts the first light portion L1 at a predetermined angle relative to an imaginary line (not shown) that is normal to the substrate 50*b* and that extends between the lower and upper surfaces of the substrate 50*b*. In accordance with this illustrative embodiment, the tilt angle ranges between about 5° and 10°, and is typically about 8°.

The tilted first light portion L1 passes out of the glass substrate 50*b* and into the optical coupling structure 50*f*. The optical coupling structure 50*f* comprises a layer of replicated epoxy that operates on the wavelength of light produced by the LD 110. The optical coupling structure 50*f* is shaped to include facets 50*f*1, 50*f*2 and 50*f*3 that act as optically refractive and/or reflective elements. Facet 50*f*1 operates as a refractive element that receives the tilted first light portion L1 and tilts the beam such that the beam is normal to the upper surface 50*g*" of the glass cover 50*g* as the beam passes through the glass cover 50*g*. In other words, the facet 50*f*1 reverses the degree of tilt imparted on the first light portion L1 by the diffractive optical element 50*c*. The glass cover 50*g*, in accordance with this illustrative embodiment, does not have any optical power, and therefore, has no optical effect on light passing through it. The purpose of the glass cover 50*g* is to provide the optical beam splitter 50*a* with a clear flat surface that enables it to be easily interfaced with the lens assembly 130, as will be described below in more detail with reference to FIGS. 6-10

In the transmit direction, the refractive lens 140 of the lens assembly 130 receives this light beam that passes through the glass cover 50*g* and redirects it such that it is focused into the end of optical fiber 10 for transmission over the link 1 (FIG. 1). As indicated above, the first light portion L1 that is coupled into the end of the optical fiber 10 typically has only about 20% of the optical power of the main beam 141. Reducing the optical power of the transmitted optical data signal in this manner ensures that the optical data signal is within eye safety limits and yet has sufficient optical power to prevent signal degradation from detrimentally affecting the performance of the link 1 (FIG. 1). In addition, using the optical beam splitter 50*a* to reduce the optical power of the transmitted optical data signal obviates the need to use other methods and devices to attenuate the signal to a level that meets eye safety limits.

There are several advantages to using a relatively small tilt angle for tilting the first light portion L1 relative to the angle of incidence of the main beam on the diffractive optical element 50*c*. An amount of tilt is needed to ensure that the optical beam splitter 50*a* operates properly. For example, without some amount of tilt, light traveling in the receive direction that is coupled from the ends of the optical fibers 10 into the optical beam splitter 50*a* might be directed into the aperture (not shown) of the LD 110 efficiently, which could potentially destabilize the laser operation. In addition, the relatively small tilt angle (e.g., 8°) allows the packaging of the optical beam splitter 50*a* to be very compact and manufacturing tolerances to be relaxed. Large tilt angles can be optically and mechanically difficult to achieve. Splitters that provide large tilt angles sometimes encounter polarization issues, and the materials that are used to make them sometimes have different properties at different angles. Most coatings are designed for perpendicular applications and compensating for larger angles can be difficult. Also, coating thickness tolerances are generally tighter for larger angle designs than for smaller angle designs. Thus, the relatively small tilt angle provided by the diffractive optical element 50*c* obviates many of these manufacturing issues so that the optical beam splitter 50*a* is easier to manufacture and can be manufactured to provide high optical precision and efficiency.

The second light portion L2 has about 70% to 90%, and typically about 80%, of the optical power of the main beam 141. The second light portion L2 is the light portion that is ultimately absorbed by the beam stop 70*a* (FIG. 1). In the illustrative embodiment shown in FIG. 2, the second light portion L2 is reflected by the diffractive optical element 50*c* into a gap that exists between the LD 110 and the LD driver IC 111. The light that passes through this gap is incident on a top surface 151 of a lead frame 150. The LD 110, the LD driver IC 111, the PD 120, and the RX IC 121 are secured to the upper surface 151 of the lead frame 150 by a layer of adhesive material 155, such as epoxy. In the embodiment of FIG. 2, the light passes through the adhesive material 155 and is incident on the upper surface 151 of the leadframe 150. The light is then reflected by the upper surface 151 of the leadframe 150 onto the substrate of the LD driver IC 111 and is absorbed thereby. Thus, in accordance with this illustrative embodiment, the substrate of the LD driver IC 111 functions as the beam stop 70a shown in FIG. 1. The light may be reflected multiple times between the upper surface 151 of the leadframe 150 and the substrate of the laser driver IC 111 before the light is finally absorbed by the substrate.

The invention is not limited to using any particular device or material as the beam stop 70a. Essentially, any device or material that functions as a light trap for light of the wavelength produced by the LD 110 may be used for this purpose. For example, the adhesive material 155 may be an epoxy that is absorptive to light of the wavelength that is produced by the LD 110. As will be understood by persons skilled in the art, other types of light traps may be used for this purpose. By absorbing the second light portion L2 in this manner, the possibility of stray light detrimentally impacting the operations of the optical transceiver module 20 (FIG. 1) is eliminated.

The optical coupling system 50 also splits off a small light portion L3 of the main beam 141 for use in optical feedback monitoring. In accordance with this illustrative embodiment, the LD driver IC 111 includes an array of monitor photodiodes 161, only one of which can be seen in the side cross-sectional view of FIG. 2, for monitoring the optical output power levels of the LDs 110. The third light portion L3 typically has about 1% to 2% of the optical power of the main beam 141, which is a sufficient amount for optical feedback monitoring. The diffractive optical element 50c tilts the third light portion L3 at a relatively small angle (e.g., about 15°) relative to an imaginary line that is normal to lower surface of the substrate 50b and that extends between the lower and upper surfaces of the substrate 50b. The facets 50f2 and 50f3 act as a minor that internally reflects the third light portion L3 to fold the third light portion L3 and direct it back down through the substrate 50b and onto the monitor photodiode 161.

In the receive direction, light L4 passing out of the end of the optical fiber 10 is directed by the refractive lens 140 onto the facet 50f1. The facet 50f1 tilts the incoming beam by a predetermined tilt angle and directs it onto the diffractive optical element 50c. The predetermined tilt angle is about 8° relative to an imaginary line that is normal to the upper surface of the substrate 50b and that extends between the upper and lower surfaces of the substrate 50b. Although a small portion of the incoming beam L4 may pass through the diffractive optical element 50c and fall on the LD 110, the tilt angle and the diffraction created by the diffractive optical element 50c ensure that this small portion of light does not fall on the aperture of the LD 110, and therefore will not have a detrimental impact on the performance of the LD 110. Approximately 80% of the incoming light L4 that passes out of the end of the optical fiber 10 is directed by the diffractive optical element 50c onto the optical element 50d, which is a reflective optical element. The reflective optical element 50d is a minor that is created either by depositing a reflective layer of metal on the glass substrate 50b to form a mirror or by depositing layers of dielectric material on the glass substrate 50b to form a dielectric minor.

The light that is incident on the reflective optical element 50d is directed by the reflective optical element 50d onto a refractive lens 50e, which focuses the light onto the PD 120. Like the facets 50f1-50f3 of the optical coupling structure 50f, the refractive lens 50e is formed of replicated epoxy, as will be described below in detail with reference to FIGS. 3A-5B. Although an array of the refractive lenses 50e are formed on the glass substrate 50a, only one of the refractive lenses 50e can be seen in the cross-sectional side view of FIG. 2. Alternatively, lens 50e may also be a diffractive lens that focuses the light onto the PD 120. This diffractive lens may also be formed of replicated epoxy.

Figure 3A:
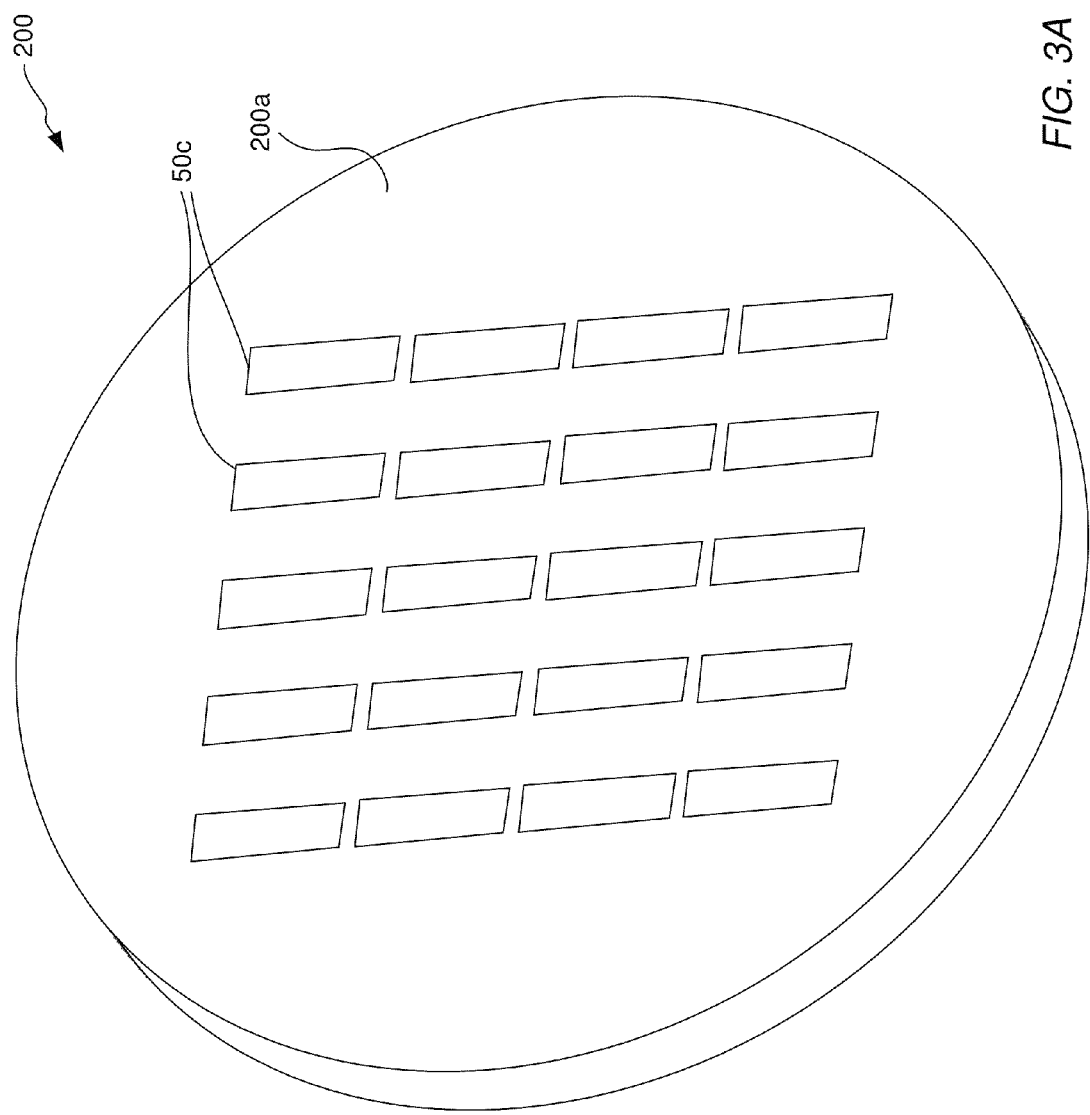

The manner in which the optical beam splitter 50a shown in FIG. 2 is fabricated will now be described with reference to FIGS. 3A-5B. FIGS. 3A and 3B illustrate bottom and top perspective views, respectively, of a glass wafer 200 having arrays of the optical elements 50c and 50d, respectively, formed on the bottom and top surfaces 200a and 200b, respectively. With reference to FIG. 3A, the optical elements 50c correspond to the diffractive optical elements 50c described above with reference to FIG. 2. Although the wafer 200 is shown in FIG. 3A as having only about twenty of the diffractive optical elements 50c arrayed on the bottom surface 200a thereof, there are typically hundreds or thousands of the diffractive optical elements 50c formed on the bottom surface 200a of the wafer 200. The diffractive optical elements 50c have identical diffractive patterns formed therein. The diffractive patterns may be formed in a variety of ways, such as by etching, chemical vapor deposition (CVD), sputtering, etc. Each of the diffractive patterns is essentially a holographic pattern made up of a series of depth variations in the bottom surface 200a, which can be formed by either removing portions in selected areas of the bottom surface 200a to create the depth variations or by adding material (e.g., metal) to selected areas of the bottom surface 200a to create the depth variations. For example, a wet or dry etching technique may be used to remove selected portions of the bottom surface 200a, whereas CVD or sputtering may be used to selective add material to the bottom surface 200a of the wafer 200.

With reference to FIG. 3B, the optical elements 50d correspond to the refractive optical elements 50d shown in FIG. 2. The refractive optical elements 50d are minors formed either by depositing a reflective coating (e.g., metal) on the top surface 200b or by depositing layers of a dielectric material on the top surface 200b to create a dielectric minor. Although the wafer 200 is shown in FIG. 3B as having only about twenty of the refractive optical elements 50d arrayed on the top surface 200b of the wafer 200, there are typically hundreds or thousands of the refractive optical elements 50d formed on the top surface 200b of the wafer 200.

Figure 4A:
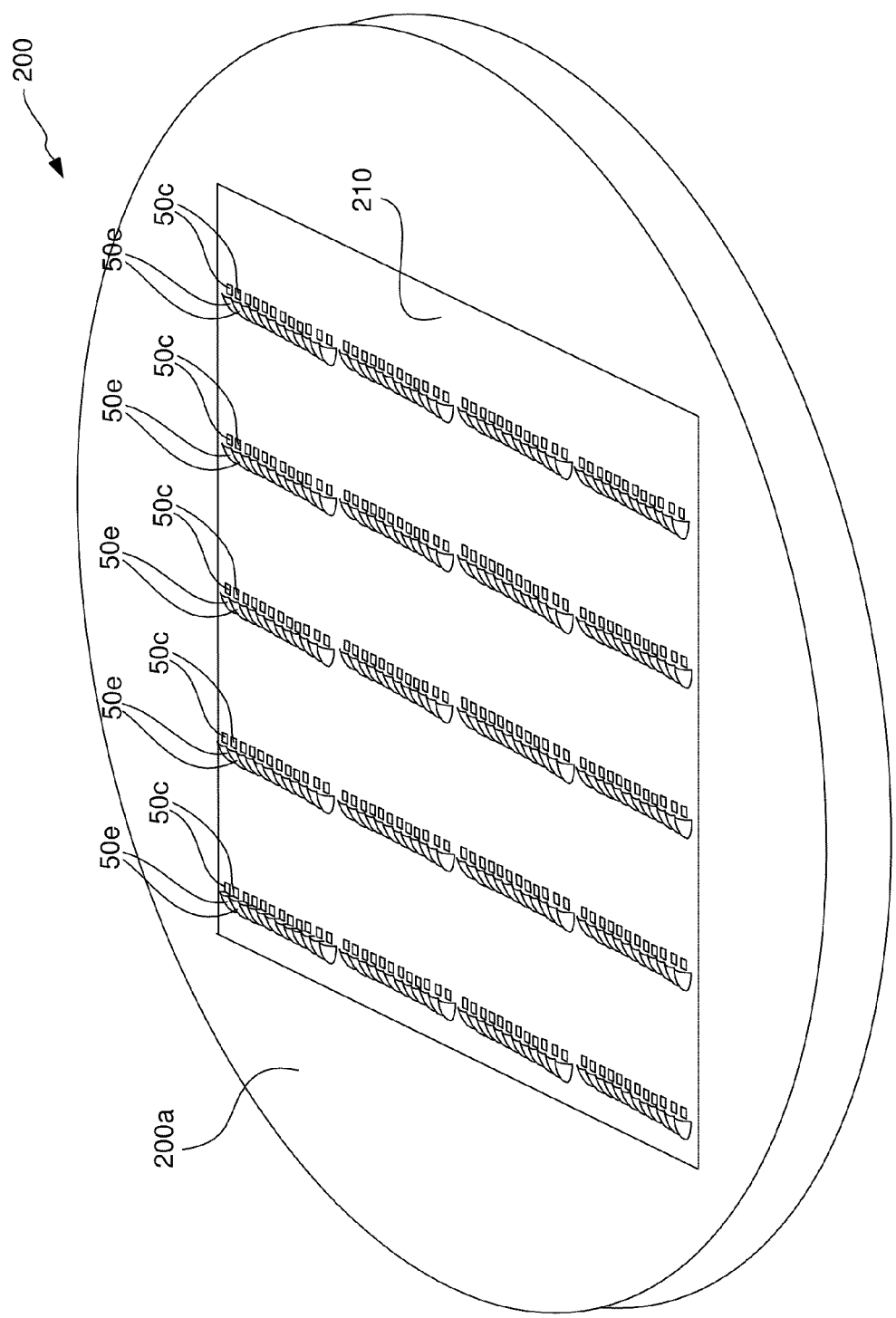
FIGS. 4A and 4B illustrate the bottom and top surfaces of the wafer shown in FIGS. 3A and 3B after an epoxy replication process has been used to form the refractive optical elements on the bottom surface of the wafer and to form the optical coupling structure on the top surface of the wafer.
Figure 4B:
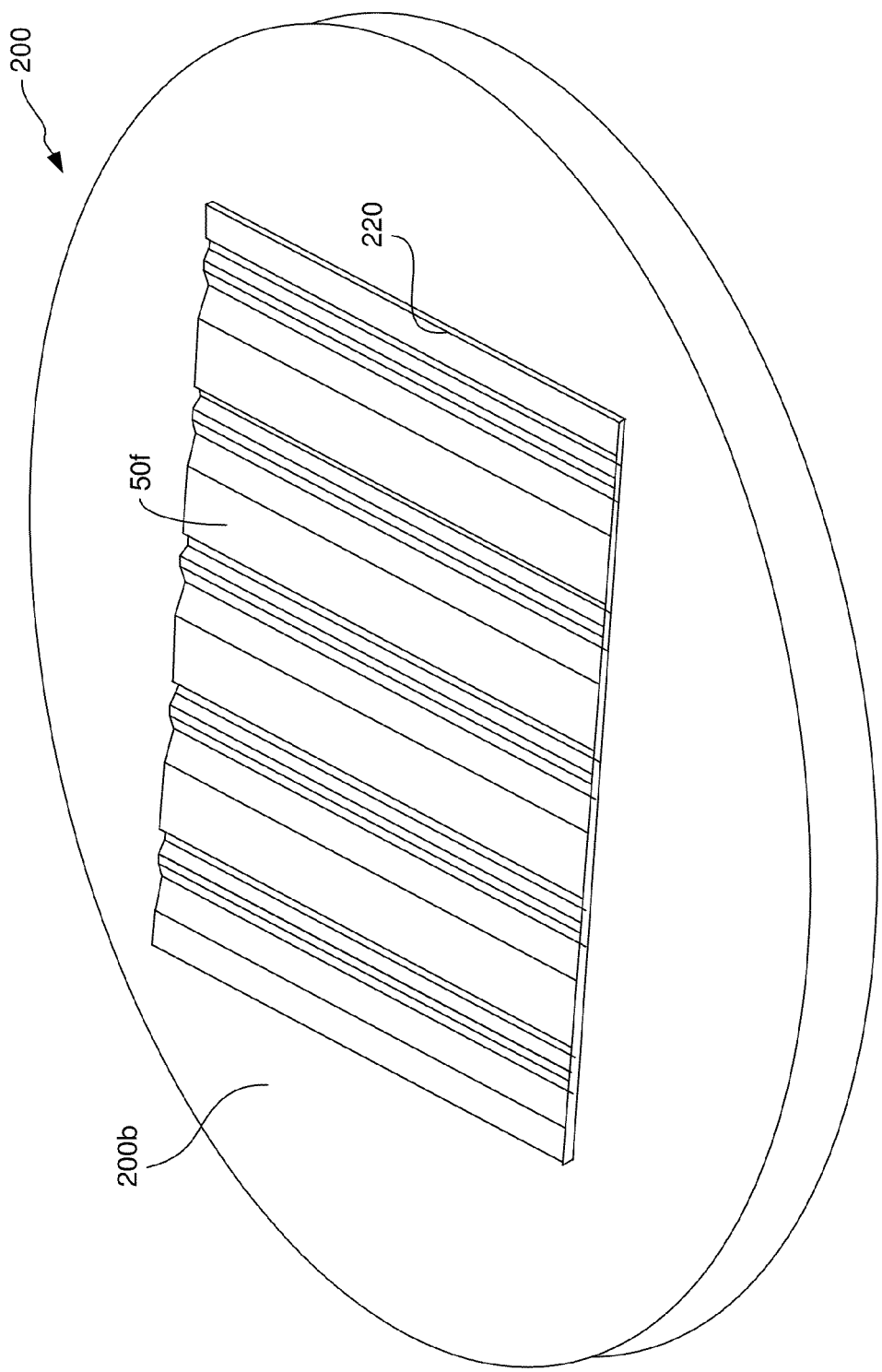

FIGS. 4A and 4B illustrate the bottom and top surfaces 200a and 200b of the wafer 200 after an epoxy replication process has been used to form the refractive optical elements 50e on the bottom surface 200a of the wafer 200 and to form the optical coupling structure 50f on the top surface 200b of the wafer 200. The epoxy replication process is a known process that uses a master, or mold, to create a pattern, or replica that is transferred to another surface. During the epoxy replication process, a master having a shape corresponding to the shape of the array of optical elements 50e is filled with a liquid epoxy. The epoxy is then cured to transfer the shape of the master into the cured epoxy, thereby forming an epoxy replica 210. The master is separated from the epoxy replica 210, leaving the replica 210 disposed on the bottom surface 200a of the wafer 200 as shown in FIG. 4A. The epoxy replica 210 covers the array of diffractive optical elements 50c, but is transparent to the wavelength of light that is produced by the LD 110. Similarly, on the top surface 200b of the wafer 200, the epoxy replication process is performed during which a master having a shape corresponding to the shape of the optical coupling structure 50f is filled with a liquid epoxy. The epoxy is then cured to transfer the shape of the master into the cured epoxy, thereby forming an epoxy replica 220. The master is then separated from the replica 220, leaving the replica 220 disposed on the top surface 200b of the wafer 200 as shown in FIG. 4B.

Figure 5A:
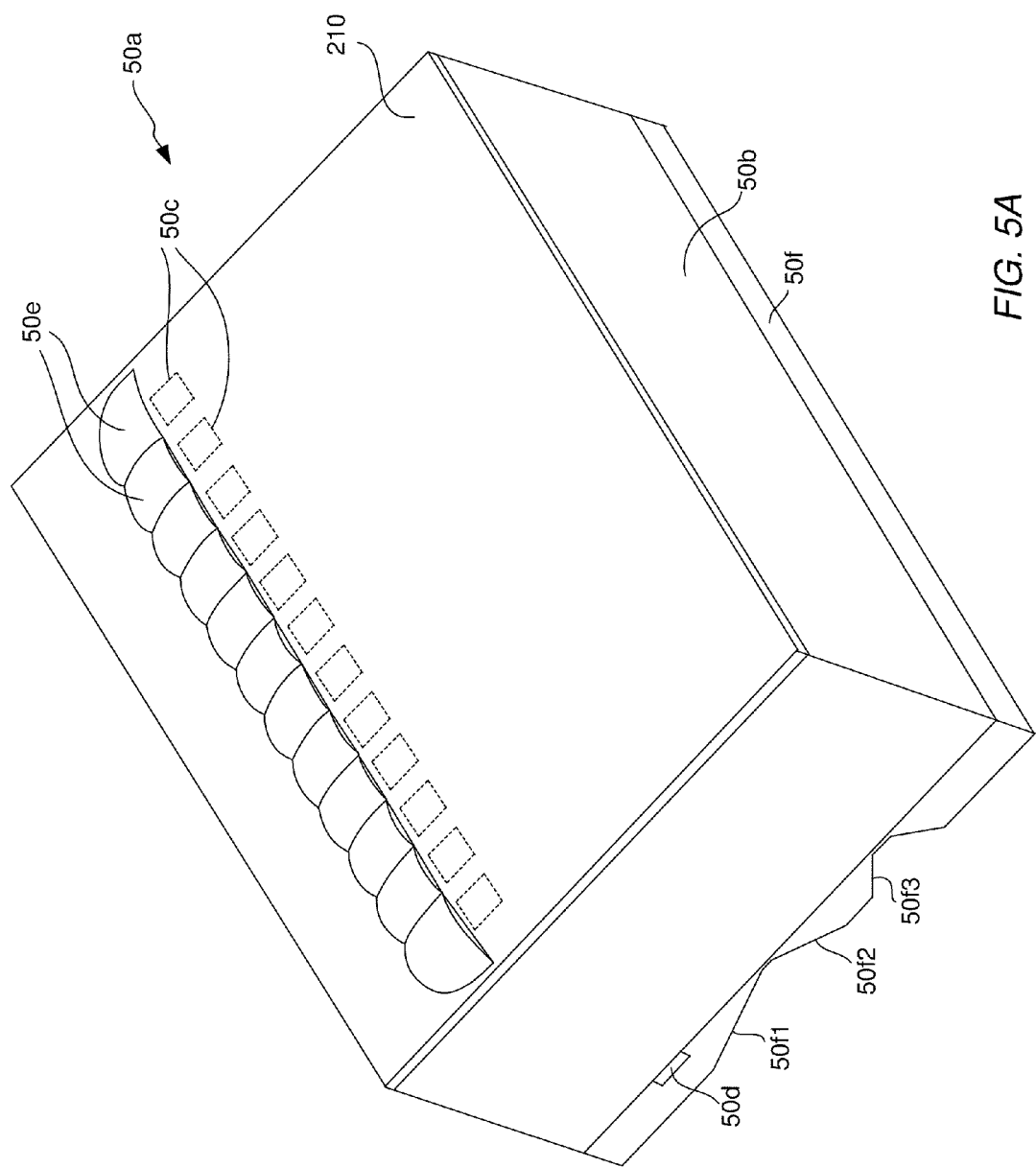
FIGS. 5A and 5B illustrate bottom and top perspective views, respectively, of the optical beam splitter shown in FIG. 2.
Figure 5B:
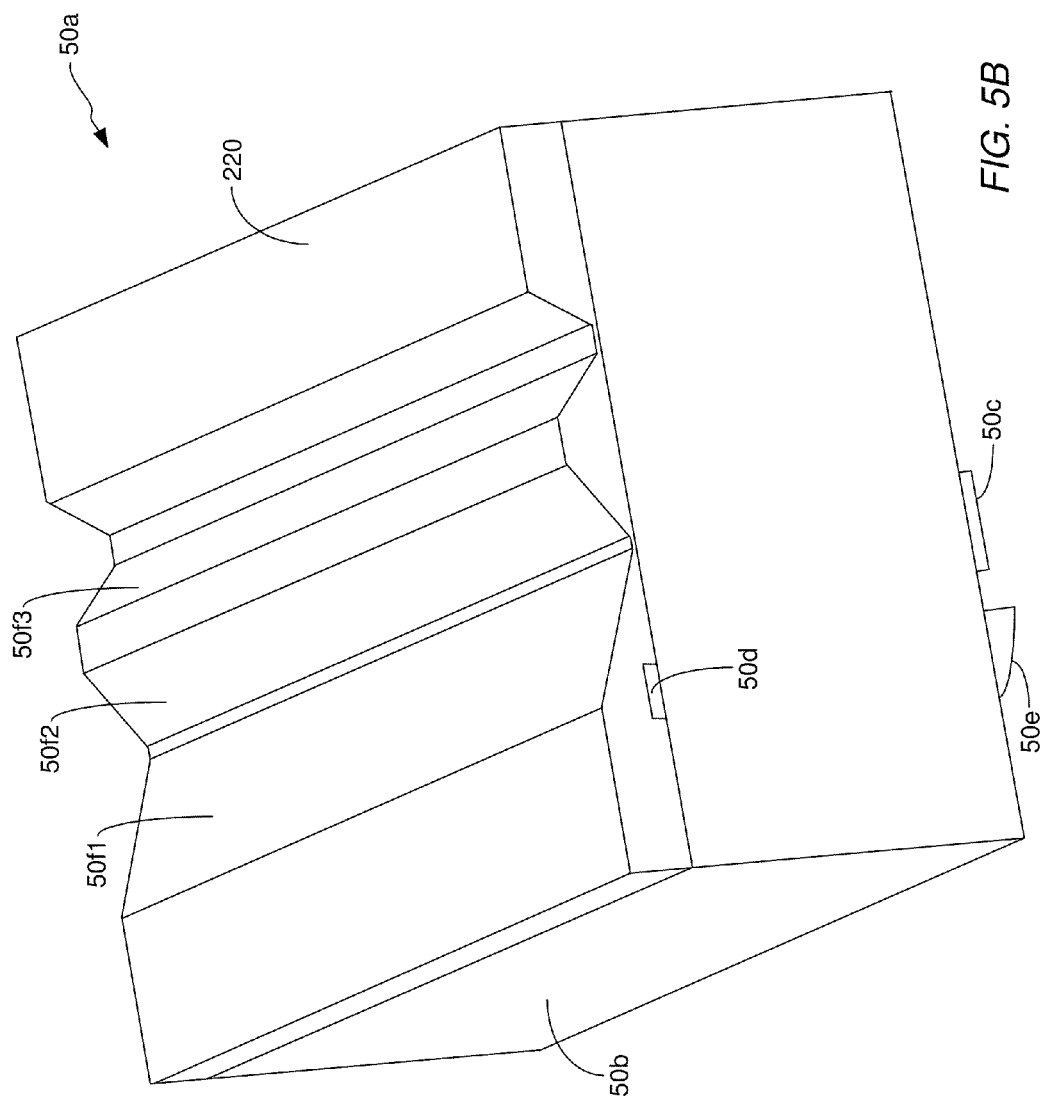

FIGS. 5A and 5B illustrate bottom and top perspective views, respectively, of the optical beam splitter 50*a* shown in FIG. 2. After the epoxy replicas 210 and 220 have been created in the manner described above with reference to FIGS. 4A and 4B, a singulation process is performed during which the wafer 200 is sawed to separate the optical beam splitters 50*a* from one another. As indicated above, hundreds or thousands of the optical beam splitters 50*a* may be formed on a single wafer 200. Therefore, the manufacturing yield for the optical beam splitter 50*a* is very high and the splitters 50*a* are manufactured with very high precision. The optical beam splitter 60*a* shown in FIG. 2 is made by the same process and has a configuration that is identical to the configuration of the optical beam splitter 50*a* described above with reference to FIGS. 2-5A.

Figure 6:
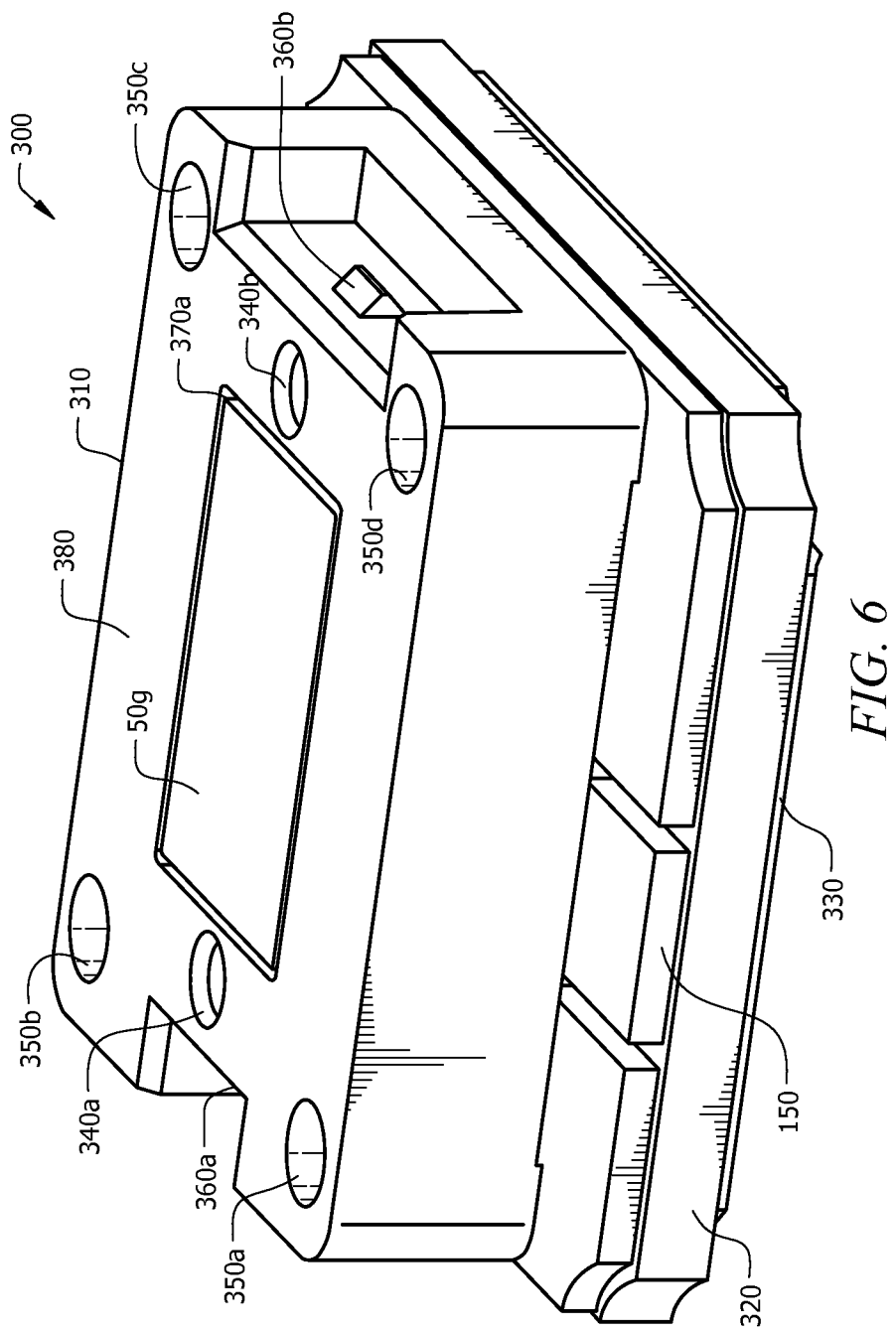
FIG. 6 illustrates a top perspective view of an optical transceiver module having an optical beam splitter holder coupled therewith that holds the optical beam splitter shown in FIG. 2.
Figure 7:
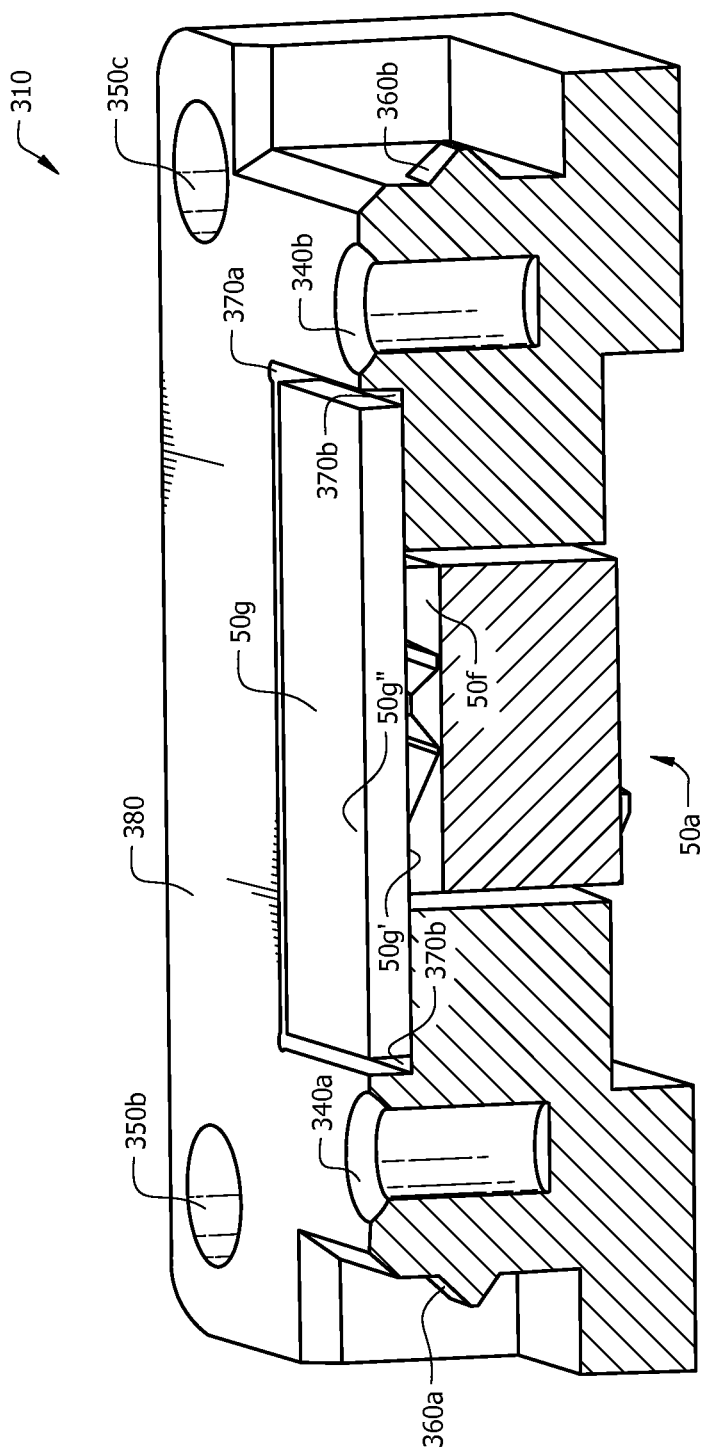
FIG. 7 illustrates a cross-sectional perspective view of the optical beam splitter holder shown in FIG. 6 with the optical beam splitter held therein.

FIG. 6 illustrates a top perspective view of an optical transceiver module 300 having an optical beam splitter holder 310 coupled therewith that holds the optical beam splitter 50*a* shown in FIG. 2. In FIG. 6, the only component of the optical beam splitter 50*a* that is visible is the glass cover 50*g*. FIG. 7 illustrates a cross-sectional perspective view of the optical beam splitter holder shown in FIG. 6 with the optical beam splitter 50*a* held therein. With reference to FIG. 6, the optical transceiver module 300 includes a printed circuit board (PCB) 320, the leadframe 150 shown in FIG. 2 mounted on an upper surface of the PCB 320, and although not visible in FIG. 6, the LD 110, the LD driver IC 111, the PD 120 and the RX IC 121 shown in FIG. 2 mounted on the leadframe 150. The LD 110, the LD driver IC 111, the PD 120 and the RX IC 121 are blocked from view in FIG. 6 by the optical beam splitter holder 310. The PCB 320 has a land grid array (LGA) 330 formed on the lower surface thereof for electrically coupling the LD 110, the LD driver IC 111, the PD 120, and the RX IC 121 to electrical contacts (not shown) of a motherboard (not shown) on which the optical transceiver module 300 may be mounted.

Holes 340*a* and 340*b* formed in opposite ends of the optical beam splitter holder 310 are shaped and sized to receive pins (not shown) located on the lens assembly 130 (FIG. 2), as will be described below with reference to FIG. 9B. Holes 350*a*-350*d* formed in the optical beam splitter holder 310 are used to align the optical beam splitter holder 310 with the optical transceiver module 300 when the optical beam splitter holder 310 is being mounted on the optical transceiver module 300. Retention features 360*a* and 360*b* formed on opposite ends of the optical beam splitter holder 310 are used to mechanically couple the holder 310 to an optical connector (not shown), as will be described below in more detail with reference to FIGS. 8-9B.

With reference to the cross-sectional perspective view of FIG. 7, the manner in which the optical beam splitter 50*a* is held within the optical beam splitter holder 310 is demonstrated. The lower surface 50*g*″ of the glass cover 50*g* is mechanically coupled with the optical coupling structure 50*f* of the optical beam splitter 50*a*. The optical beam splitter holder 310 has an opening 370*a* formed therein for receiving and mating with the optical beam splitter 50*a*. Portions of the lower surface 50*g*″ of the glass cover 50*g* rest on a recessed ledge 370*b* formed within the opening 370*a*. The portions of the lower surface 50*g*″ of the glass cover 50*g* that rest on the recessed ledge 370*b* may be secured to the recessed ledge 370*b* by an adhesive material (not shown) to mechanically couple the optical beam splitter 50*a* to the optical beam splitter holder 310. The upper surface 50*g*″ of the glass cover 50*g* is flush with the upper surface 380 of the optical beam splitter holder 310. These features eliminates gaps and enable the upper surface 50*g*″ of the glass cover 50*g* to be easily cleaned by wiping the upper surface 50*g*″ with a finger or a piece of cloth or other material. This is not a feature of optical transceiver modules that are currently available in the market. Most currently available optical transceiver modules have gaps in them that trap contaminates. Efforts to remove these contaminates are sometimes made by blowing air into the gaps, but oftentimes such efforts are unsuccessful. Of course, contaminates existing in the optical pathways can detrimentally affect the performance of the optical transceiver modules. Thus, providing a beam splitter configuration that enables the glass cover 50*g* to be wiped clean to remove contaminates is highly advantageous.

Figure 8:
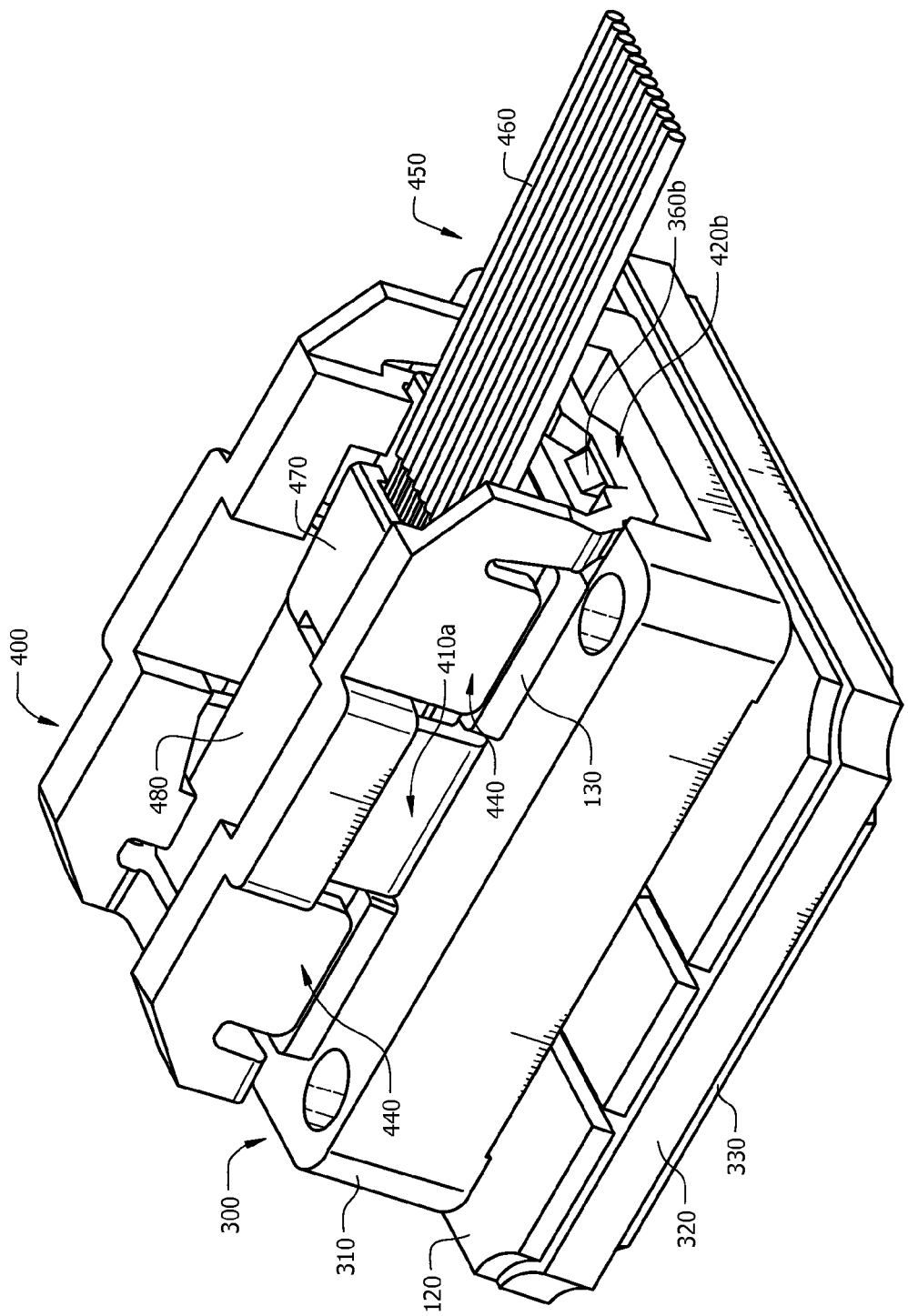
FIG. 8 illustrates a perspective view of the optical transceiver module shown in FIG. 6 having an optical connector coupled to it, which, in turn, has the lens assembly shown in FIG. 2 coupled to it.
Figures 9A, 9B:
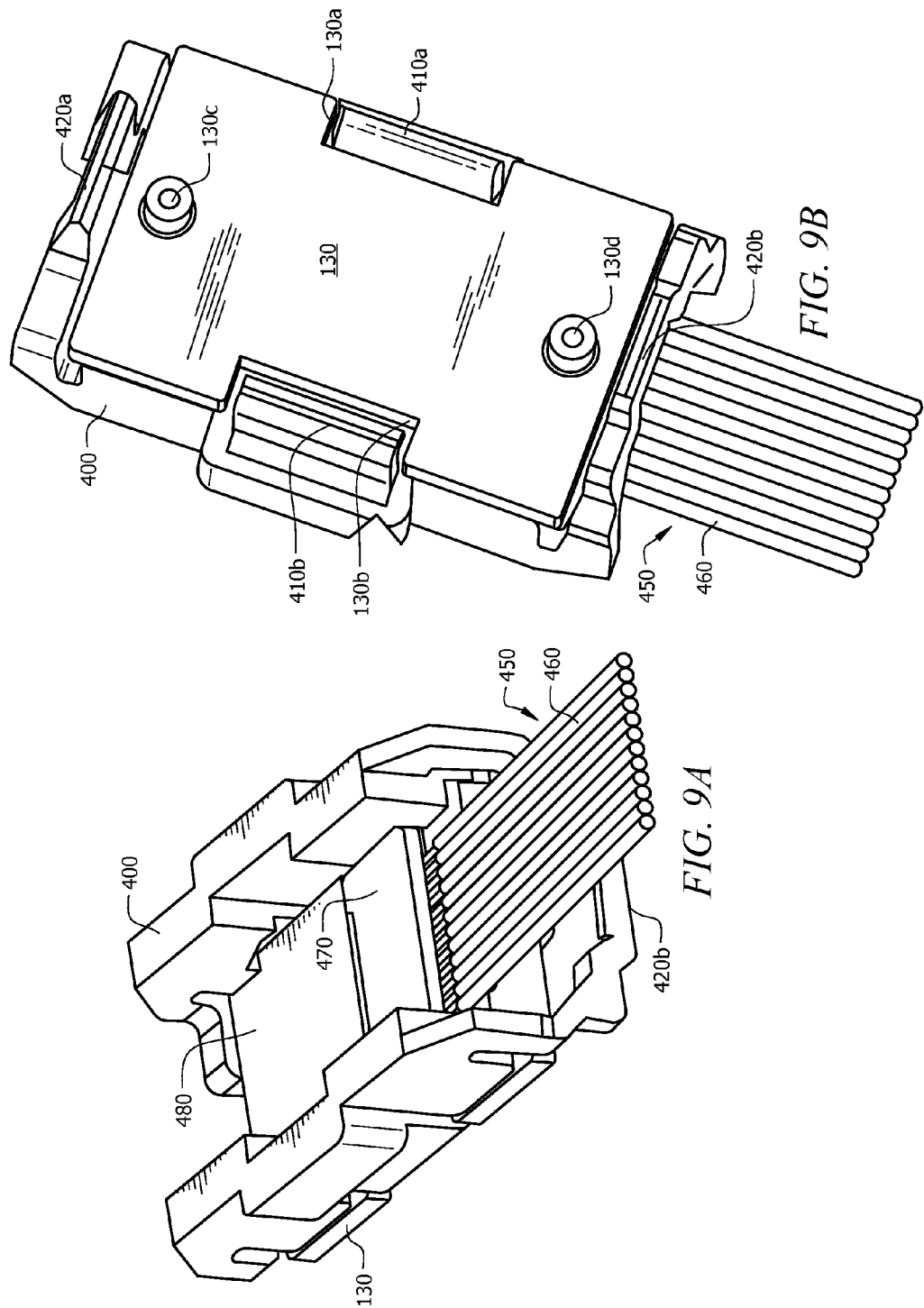
FIGS. 9A and 9B illustrate top and bottom perspective views, respectively, of the optical connector shown in FIG. 8 having the lens assembly shown in FIG. 2 coupled to it.

FIG. 8 illustrates a perspective view of the optical transceiver module 300 shown in FIG. 6 having an optical connector 400 coupled to it, which, in turn, has the lens assembly 130 shown in FIG. 2 coupled to it. FIGS. 9A and 9B illustrate top and bottom perspective views, respectively, of the optical connector 400 shown in FIG. 8 having the lens assembly 130 shown in FIG. 2 coupled to it. The lens assembly 130 is mechanically coupled to the optical connector 400 by snap brackets 410*a* and 410*b* formed on the optical connector 400 that snap into indentations 130*a* and 130*b*, respectively, formed in the lens assembly 130. The lens assembly 130 has pins 130*c* and 130*d* located thereon that mate with the holes 340*a* and 340*b* (FIGS. 6 and 7), respectively, formed in the optical beam splitter holder 310. This mechanical coupling arrangement allows some freedom of movement of the lens assembly 130 relative to the optical connector 400. In other words, the lens assembly 130 "floats" relative to the optical connector 400, which ensures precision alignment of the lens assembly 130 with the optical beam splitter holder 310 when the optical connector 400 is coupled with the holder 310, as will be described below in more detail.

The optical connector 400 has latches 420*a* and 420*b* formed on opposite ends thereof that mechanically couple with the retention features 360*a* and 360*b*, respectively, formed on the optical beam splitter holder 310. Although the optical connector 400 is typically made of a molded plastic material that provides the connector 400 with a generally rigid structure, the latches 420*a* and 420*b* flex to a limited degree when engaged with the retention features 360*a* and 360*b* to provide a spring force that is exerted on the optical connector 400 to firmly press portions 440 of the optical connector 400 against the optical beam splitter holder 310. As the optical connector 400 and the optical beam splitter holder 310 are pressed together in this manner and interlocked, the pins 130*c* and 130*d* formed on the lens assembly 130 mate with the holes 340*a* and 340*b*, respectively, formed in the optical beam splitter holder 310 to precisely align the lens assembly 130 with the optical beam splitter holder 310.

An optical fiber ribbon cable 450 comprising a plurality of optical fibers 460 is coupled on an end thereof with the lens assembly 130 via a cover 470 that presses the ends of the fibers 460 against V-shaped grooves (not shown) formed in the lens assembly 130, as will be described below in more detail with reference to FIG. 10. The refractive lenses 140 described above with reference to FIG. 2 are covered by a piece of protective tape 480 that protects the refractive lenses 140 from contaminants.

Figure 10:
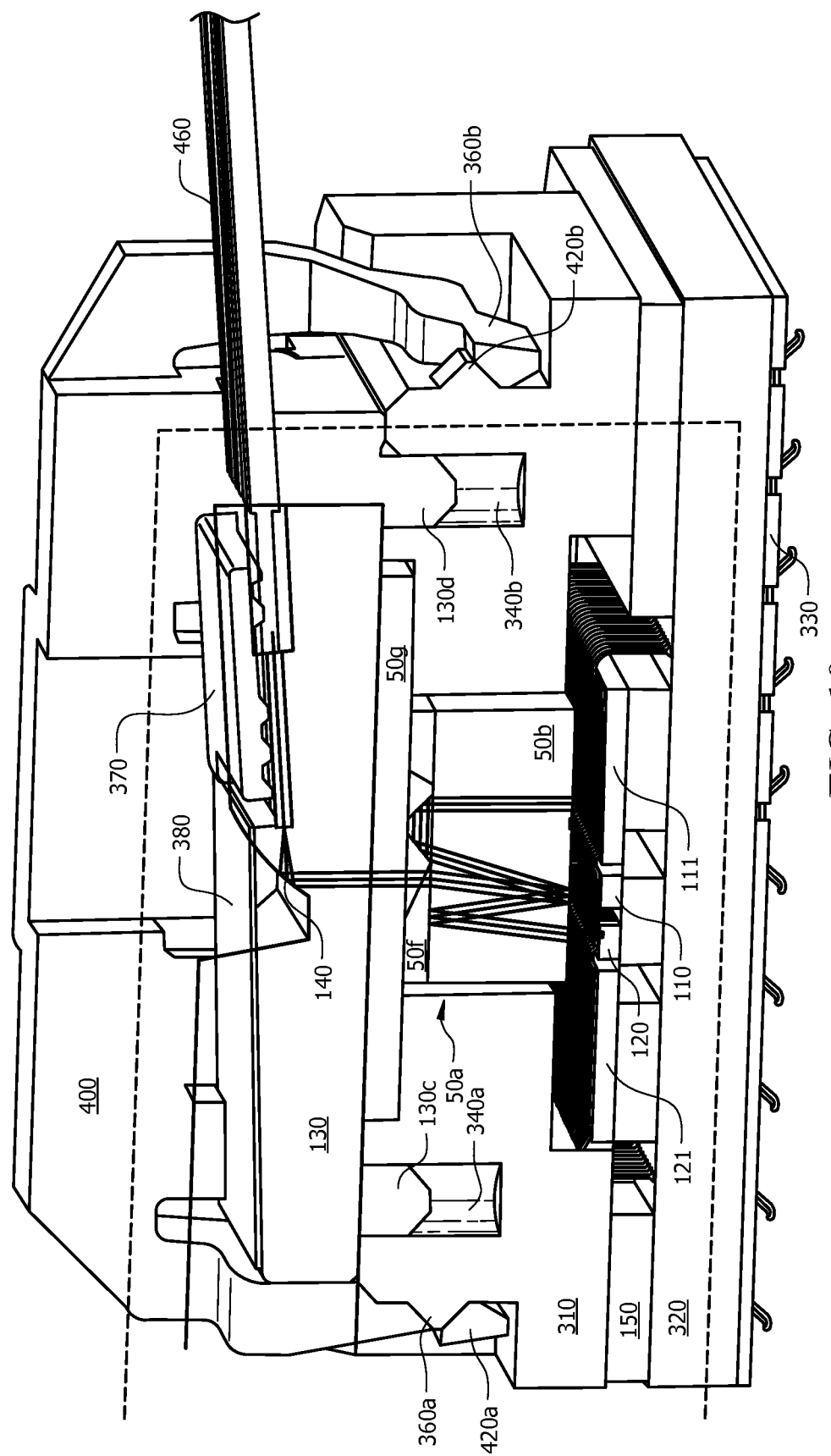
FIG. 10 illustrates a cross-sectional side view of the optical transceiver module shown in FIG. 8 coupled with the optical connector shown in FIGS. 9A and 9B, which, in turn, is coupled with the lens assembly.

FIG. 10 illustrates a cross-sectional side view of the optical transceiver module 300 shown in FIG. 8 coupled with the optical connector 400, which, in turn, is coupled with the lens assembly 130. In FIG. 10, the manner in which light is coupled between the ends of the optical fibers 460 and the optical beam splitter 50*a* is demonstrated. Like reference numerals in FIGS. 8-10 represent like components. With reference to FIG. 10, the refractive lenses 140 formed on the lens assembly 130 are 45° mirrors. In the transmit direction, light produced by the LDs 110 is guided by the optical beam splitter 50*a* in the manner described above with reference to FIG. 2 and is directed be the splitter 50*a* through the glass cover 50*g*. The light directed through the glass cover 50*g* is incident on the refractive lenses 140 and is reflected at 45° angles onto the ends of respective optical fibers 460. In the receive direction, light passing out of the ends of the optical fibers 460 is incident on the refractive lenses 140 and is reflected at 45° angles such that the light is directed through the glass cover 50*g* and is incident on the optical coupling structure 50*f*. The received light is then guided in the manner described above with reference to FIG. 2.

It should be noted that the invention has been described with reference to a few illustrative, or exemplary, embodiments for the purposes of demonstrating the principles and concepts of the invention. It will understood by persons skilled in the art that the invention is not limited to the embodiments described herein and that many modifications may be made to the embodiments described herein without deviating from the invention. For example, the invention is not limited to any particular configuration for the optical beam splitter 50*a* or to any particular percentages for the optical power of the light portions that are split off from the main beam. Also, which the optical beam splitter 50*a* has been described as having a bidirectional configuration for implementation in a bidirectional link, the principles and concepts described herein are equally applicable to unidirectional applications.

What is claimed is:

1. An optical beam splitter for use in an optoelectronic module, the optical beam splitter comprising:
    a substrate having at least upper and lower surfaces that are substantially parallel to one another;
    at least a first diffractive optical element formed on the outside of the lower surface of the substrate, the first diffractive optical element receiving a main beam of light produced by a light source and splitting the main beam into at least first and second light portions L1 and L2, respectively, and tilting at least the first light portion L1 at a first preselected non-zero tilt angle relative to an imaginary line that is normal to the lower surface of the substrate and that extends between the lower and upper surfaces of the substrate, the first and second light portions L1 and L2 each having a particular percentage of an optical power of the main light beam, and wherein the second light portion L2 has a substantially larger percentage of the optical power of the main light beam than the first portion L1; and
    at least a first refractive optical element formed on the outside of the upper surface of the substrate, the first refractive optical element receiving the tilted first light portion L1 and directing the first light portion L1 onto a lens assembly of the optoelectronic module to optically couple the first light portion L1 into an end of an optical fiber coupled to the lens assembly, and wherein the optical power of the first light portion L1 that is directed onto the lens assembly is within a human eye safety limit.

2. The optical beam splitter of claim 1, wherein the first light portion L1 has about 20% of the optical power of the main light beam and wherein the second light portion L2 has about 80% of the optical power of the main light beam.

3. The optical beam splitter of claim 2, wherein the first diffractive element directs the second light portion L2 onto an optical beam stop.

4. The optical beam splitter of claim 1, wherein the first diffractive optical element splits the main light beam into the first and second light portions L1 and L2 and into a third light portion L3, and wherein the optical beam splitter further comprises:
    at least a first mirroring optical element formed on the upper surface of the substrate, and wherein the first mirroring optical element receives the third light portion L3 and directs the third light portion L3 through the bottom surface of the substrate onto a monitor light detector of the optoelectronic module that is used to monitor an optical output power level of the light source of the optoelectronic module.

5. The optical beam splitter of claim 4, wherein at least the first mirroring optical element and the first refractive optical element are formed of replicated epoxy.

6. The optical beam splitter of claim 1, wherein light passing out of an end of an optical fiber coupled to the lens assembly is directed by the lens assembly onto the first refractive element, and wherein the first refractive element tilts the received light at a predetermined angle relative to an imaginary line that is normal to the upper surface of the substrate and that extends between the upper and lower surfaces of the substrate and directs the tilted received light onto the first diffractive optical element, and wherein the first diffractive optical element directs the tilted received light toward to the upper surface of the substrate, and wherein the optical beam splitter further comprises:
    at least a second mirroring optical element formed on the upper surface of the substrate, and wherein the second mirroring optical element reflects the light directed by the first diffractive optical element toward the upper surface of the substrate toward the lower surface of the substrate; and
    at least a second refractive optical element formed on the lower surface of the substrate, the second refractive optical element directing the light reflected by the second mirroring optical element onto a receiver light detector of the optoelectronic module disposed adjacent the lower surface of the substrate.

7. The optical beam splitter of claim 6, wherein at least the first and second refractive optical elements are formed of replicated epoxy.

8. The optical beam splitter of claim 6, wherein the first diffractive optical element and the second mirroring optical element are formed of metal.

9. The optical beam splitter of claim 1, wherein the first preselected tilt angle is between about 5 degrees and 10 degrees.

10. The optical beam splitter of claim 9, wherein the first preselected tilt angle is about 8 degrees.

11. A method of performing optical beam splitting in an optoelectronic module, the method comprising:
    with a first diffractive optical element formed on the outside of a lower surface of a substrate, receiving a main beam of light produced by a light source of the optoelectronic module;
    with the first diffractive optical element, splitting the main beam into at least first and second light portions L1 and L2, respectively, and tilting at least the first light portion L1 at a first preselected non-zero tilt angle relative to an imaginary line that is normal to the lower surface of the substrate and that extends between the lower and upper surfaces of the substrate, wherein the first and second light portions L1 and L2 each have a particular percentage of an optical power of the main light beam, and wherein the second light portion L2 has a substantially larger percentage of the optical power of the main light beam than the first portion L1; and with at least a first refractive optical element formed on the outside of the upper surface of the substrate, receiving the tilted first light portion L1 and directing the first light portion L1 onto a lens assembly of the optoelectronic module to optically couple the first light portion L1 into an end of an optical fiber coupled to the lens assembly, and wherein the optical power of the first light portion that is directed by the first refractive optical element onto the lens assembly is within a human eye safety limit.

12. The method of claim 11, wherein the first diffractive element directs the second light portion L2 onto an optical beam stop.

13. The method of claim 11, wherein the first diffractive optical element splits the main light beam into the first and second light portions L1 and L2 and into a third light portion L3, and wherein the method further comprises:

with a first mirroring optical element formed on the upper surface of the substrate, receiving the third light portion L3 and directing the third light portion L3 through the lower surface of the substrate onto a monitor light detector of the optoelectronic module that is used to monitor an optical output power level of the light source of the optoelectronic module.

14. The method of claim 13, wherein at least the first mirroring optical element and the first refractive optical element are formed of replicated epoxy.

15. The method of claim 11, further comprising:

with the first refractive optical element, receiving light passing out of an end of an optical fiber coupled to the lens assembly and directing the received light onto the first diffractive optical element;

with the first diffractive element, receiving the light directed by the first refractive element onto the first diffractive element and directing the received light toward to the upper surface of the substrate;

with a second mirroring optical element formed on the upper surface of the substrate, reflecting the light directed by the first diffractive optical element toward the upper surface of the substrate toward the lower surface of the substrate; and with a second refractive optical element formed on the lower surface of the substrate, directing the light reflected by the second mirroring optical element onto a receiver light detector of the optoelectronic module.

16. The method of claim 15, wherein at least the first and second refractive optical elements are formed of replicated epoxy.

17. The method of claim 15, wherein the first diffractive optical element and the second mirroring optical element are formed of metal.

18. The method of claim 11, wherein the first preselected tilt angle is between about 5 degrees and 10 degrees.

19. The method of claim 18, wherein the first preselected tilt angle is about 8 degrees.

20. The method of claim 11, wherein the first light portion L1 has about 20% of the optical power of the main light beam and wherein the second light portion has about 80% of the optical power of the main light beam.

* * * * *